United States Patent
Jeon et al.

(10) Patent No.: US 11,763,896 B2
(45) Date of Patent: *Sep. 19, 2023

(54) PREREAD AND READ THRESHOLD VOLTAGE OPTIMIZATION

(71) Applicant: Micron Technology, Inc., Boise, ID (US)

(72) Inventors: Seungjune Jeon, Santa Clara, CA (US); Zhenming Zhou, San Jose, CA (US); Zhenlei Shen, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/951,593

(22) Filed: Sep. 23, 2022

(65) Prior Publication Data

US 2023/0017981 A1    Jan. 19, 2023

Related U.S. Application Data

(63) Continuation of application No. 17/171,486, filed on Feb. 9, 2021, now Pat. No. 11,501,838, which is a
(Continued)

(51) Int. Cl.
*G11C 16/34* (2006.01)
*G11C 16/26* (2006.01)
(Continued)

(52) U.S. Cl.
CPC .......... *G11C 16/34* (2013.01); *G06F 9/30101* (2013.01); *G11C 16/10* (2013.01); *G11C 16/26* (2013.01); *G11C 29/42* (2013.01)

(58) Field of Classification Search
CPC ............................. G11C 16/34; G06F 9/30101
(Continued)

(56) References Cited

U.S. PATENT DOCUMENTS

| 9,454,420 B1 | 9/2016 | Tai et al. |
| 10,950,315 B1 * | 3/2021 | Jeon ............... G11C 29/028 |

(Continued)

FOREIGN PATENT DOCUMENTS

| CN | 107039080 | 8/2017 |
| CN | 107943712 | 4/2018 |

OTHER PUBLICATIONS

PCT Notification of Transmittal Of The International Search Report And The Written Opinion Of The International Searching Authority for PCT Application PCT/US2020/065167, dated Mar. 30, 2021, 9 pages.

(Continued)

*Primary Examiner* — Muna A Techane
(74) *Attorney, Agent, or Firm* — Lowenstein Sandler LLP

(57) ABSTRACT

A request to read data at the memory device is received. A first read operation is performed to read the data at the memory device using a first read threshold voltage. The data read at the memory device using the first read threshold voltage is determined to be associated with a first unsuccessful correction of an error. Responsive to determining that the data read at the memory device using the first read threshold voltage is associated with the first unsuccessful correction of the error, a second read threshold voltage is stored at a register to replace a preread threshold voltage previously stored at the register that is associated with the memory device. The first preread threshold voltage was previously used to perform a preread operation at the memory device. A second read operation to read the data at the memory device is performed using the second read threshold voltage.

20 Claims, 5 Drawing Sheets

Related U.S. Application Data continuation of application No. 16/715,639, filed on Dec. 16, 2019, now Pat. No. 10,950,315.

(51) Int. Cl.
*G06F 9/30* (2018.01)
*G11C 29/42* (2006.01)
*G11C 16/10* (2006.01)

(58) Field of Classification Search
USPC .................................................... 365/185.05
See application file for complete search history.

(56) References Cited

U.S. PATENT DOCUMENTS

| | | |
|---|---|---|
| 2013/0094286 A1 | 4/2013 | Sridharan et al. |
| 2015/0178156 A1 | 6/2015 | Shin |
| 2015/0234749 A1* | 8/2015 | Adachi .............. G11C 13/0069 711/159 |
| 2015/0378815 A1* | 12/2015 | Goda ................. G11C 16/3454 714/764 |
| 2016/0293271 A1 | 10/2016 | Won et al. |
| 2019/0333548 A1 | 10/2019 | McGlaughlin et al. |
| 2020/0050383 A1* | 2/2020 | Shen ..................... G06F 3/0679 |
| 2020/0118620 A1* | 4/2020 | Bazarsky ............... G11C 29/42 |
| 2021/0011769 A1* | 1/2021 | Xie ..................... G06F 12/0646 |

OTHER PUBLICATIONS

PCT Notification Concerning Transmittal Of International Preliminary Report on Patentability for PCT Application PCT/US2020/065167, dated Jun. 30, 2022, 6 pages.

USPTO, Notice of Allowance for U.S. Appl. No. 16/715,639, dated Nov. 16, 2020.

USPTO, NonFinal Office Action for U.S. Appl. No. 17/171,486, dated Mar. 17, 2022.

USPTO, Notice of Allowance for U.S. Appl. No. 17/171,486, dated Jun. 29, 2022.

Notice of Rejection for Japanese Patent Application No. 2022-536676, dated Feb. 7, 2023, 12 pages.

\* cited by examiner

PREREAD AND READ THRESHOLD VOLTAGE OPTIMIZATION

RELATED APPLICATIONS

This application is a continuation of U.S. patent application Ser. No. 17/171,486 filed on Feb. 9, 2021, which is a continuation of U.S. patent application Ser. No. 16/715,639 filed on Dec. 16, 2019 and issued as U.S. Pat. No. 10,950,315 on Mar. 16, 2021. The above-referenced applications are incorporated by reference herein.

TECHNICAL FIELD

Embodiments of the disclosure relate generally to memory sub-systems, and more specifically, relate to a preread and read threshold voltage optimization for memory sub-systems.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
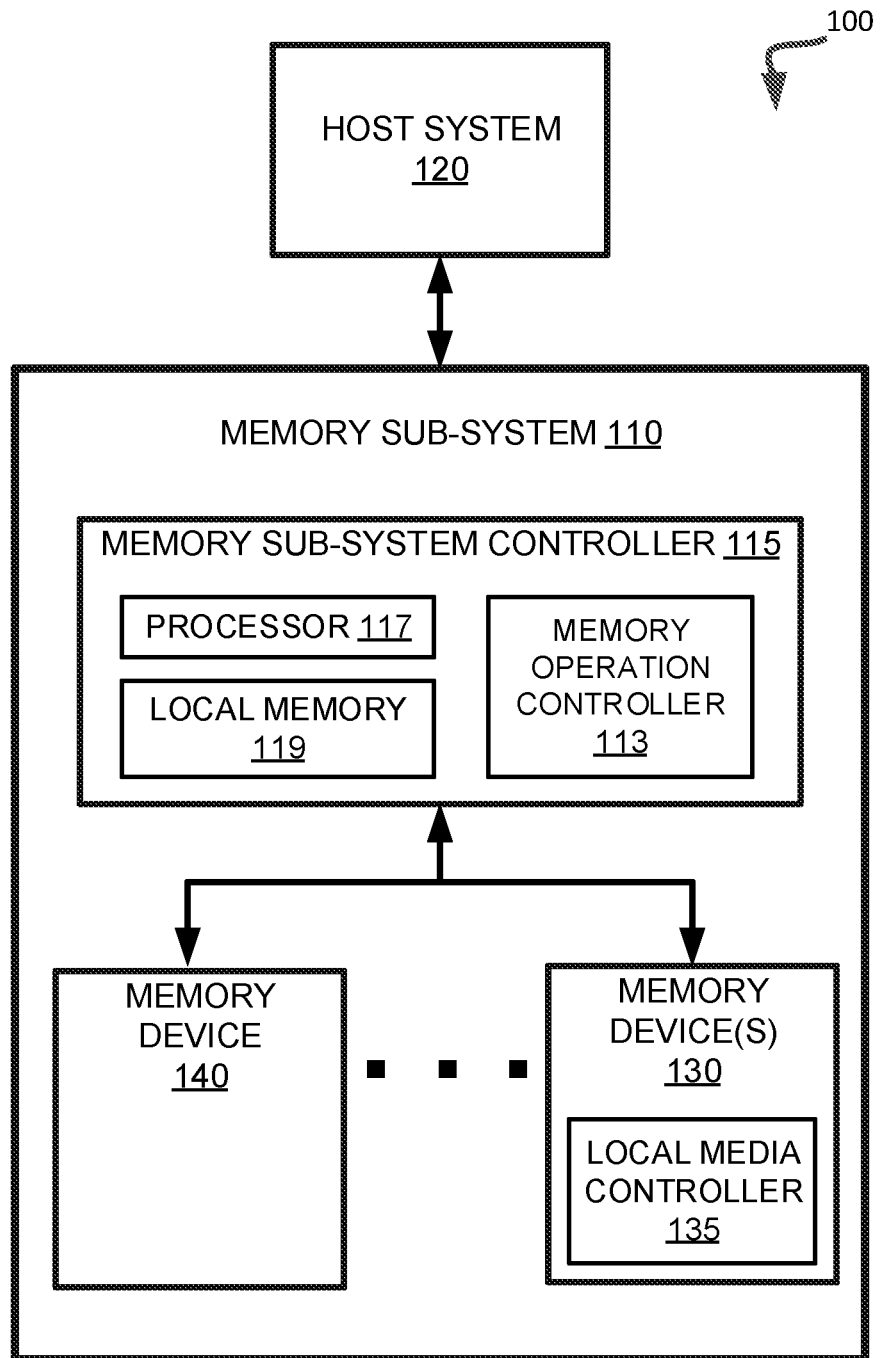
FIG. 1 illustrates an example computing system that includes a memory sub-system in accordance with some embodiments of the present disclosure.

Aspects of the present disclosure are directed to preread and read threshold voltages used in performing memory operations at memory sub-systems. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

A read threshold voltage or preread threshold voltage can refer a voltage level that is used to respectively read or preread data stored at memory cells of a memory component. A read operation, preread operation, and write operation are examples of memory operations performed during the operation of a memory sub-system. A read operation can read data stored at one or more memory cells using one or more read threshold voltages. A write operation can write data to one or more memory cells of a memory component. A preread operation can be associated with a write operation. Before a write operation is performed, a preread operation can read the contents of one or more memory cells and compare the contents of the one or more memory cells to the data to be written at the one more memory cells. Memory cells that have contents (e.g., logical "1" or logical "0") that differ from data to be written can be written during the write operation such that the contents of the memory cells are changed (e.g., from a logical "1" to a logical "0" and vice versa). Memory cells that have contents that match the data to be written are not written to and the contents of the memory are unchanged (e.g., maintained at a logical "1" or logical "0"). Writing only to memory cells that have contents that differ from the data to be written allows the memory cells of memory components to experience fewer write cycles, which enhances the endurance of the memory components and memory sub-system.

Conventional memory sub-systems can have a limited number of registers at which to store threshold voltages. The threshold voltages stored at the registers of conventional memory sub-systems can be used for both read operations and preread operations. In some instances, the threshold voltages can be optimized to perform read operations and are not optimized to perform preread operations. Performing preread operations using threshold voltages that are optimized for read operations can cause the preread operation to identify many false-positives, i.e., where the preread operation identifies memory cells whose contents do not match data to be written even though the actual contents of the memory cells match the data to be written. As such, many memory cells that do not need to be written are in fact written during a write operation, which increases the wear on memory cells and decreases the useful life of the memory component and memory sub-system.

Aspects of the disclosure address the above and other deficiencies by implementing one or more different threshold voltages for preread operations and read operations. One or more preread threshold voltages can be optimized for performing preread operations and one or more read threshold voltage can be optimized for performing read operations. An optimized preread threshold voltage can be different than any of the read threshold voltages used to perform read operations. As noted above, in some cases the number of registers that store threshold voltages can be limited. The optimized preread threshold voltage can be more frequently used than a particular read threshold voltage, and can be the effective "default" threshold voltage that is stored at a particular register. The optimized preread threshold voltage stored at the particular register can be replaced by the particular read threshold voltage under certain conditions, such as after an unsuccessful correction of an error in data read from the memory component by a read operation using a different read threshold voltage. After the read operation is performed using the corresponding read threshold voltage, the particular read threshold voltage can be replaced by the optimized preread threshold voltage at the register.

In some embodiments, memory sub-system can receive a request to perform a write operation to write data at memory component. Responsive to receiving the request to write data at the memory component, memory sub-system can perform a preread operation to read the data at the memory component using the preread threshold voltage stored at the register.

In some embodiments, the memory sub-system receives a request to read data at the memory component. Responsive to the request, the memory sub-system can perform a read operation to read data at the memory component using an initial read threshold voltage. The memory sub-system can determine that the data read at the memory component using the initial read threshold voltage is associated with an unsuccessful correction of an error. For example, the data read from the memory component can contain an error that is not correctable using error detection and error-correcting code (ECC).

Responsive to determining that the data read at the memory component using the initial read threshold is associated with an unsuccessful correction of an error, the memory sub-system can store a subsequent read threshold voltage at the register to replace the preread threshold voltage previously stored at the register. A subsequent read operation can be performed to read the data at the memory component using the subsequent read threshold voltage. The data read by the subsequent read operation can be error free or have an error that is correctable. In some embodiments, responsive to performing the subsequent read operation using the subsequent read threshold voltage, the memory sub-system can replace the subsequent read threshold voltage stored at the register with the preread threshold voltage.

Advantages of the disclosure include, but are not limited to, improved performance of the memory sub-system. Using a preread threshold voltage that has been optimized for use with a preread operation rather than using a threshold voltage optimized for a read operation reduces wear on memory components and increases the useful life of the memory sub-system. Further, the aspects of the disclosure can be used to implement memory sub-systems that use a different threshold voltage for preread operations and read operations and have a limited number of registers at which to store threshold voltages.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Small Computer System Interface (SCSI), Serial Attached SCSI (SAS), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs). Although non-volatile memory components such as 3D cross-point type and NAND type flash memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In embodiments, the memory sub-system 110 includes a memory sub-system controller 115 that performs operations as described herein. In some embodiments, any component of the memory sub-system 110 can include the memory sub-system controller 115. For example, the memory sub-system controller 115 can be part of host system 120, memory sub-system controller 115, memory device 140, memory device 130, or an operating system (OS) (e.g., OS of host system 120). In another example, the memory sub-system controller 115 can include a processor 117 (processing device) configured to execute instructions stored in local memory 119 for performing the operations described herein. In some embodiments, the memory operations can include but are not limited to a write operation, a read operation, or a preread operation. In some embodiments, a preread operation can be part of a write operation.

In some embodiments, the memory operations described with respect to memory sub-system controller 115 can be performed on a non-volatile cross point array memory component. In some embodiments, a non-volatile cross point array memory component can have multiple write operation modes where each of the of the write operation modes is associated with a different write operation that writes to the non-volatile cross point array memory component in a different manner and has different trade-offs. For the sake of illustration, rather than limitation, aspects of the disclosure describe operations of the memory operation controller 113 performing a write operation (e.g., also referred to as "normal write operation" herein) of multiple write operations. It can be understood that aspects of the disclosure can be applied to different write operations.

In embodiments, a write operation can write data at memory device 130 or memory device 140 based on a comparison between data units of the data from cache memory (e.g., memory used to store data before the data is written to memory device 130 or memory device 140) and data units previously stored at the memory device 130 or memory device 140. The data units that were previously written to memory device 130 or memory device 140 can still be present at memory device 130 or memory device 140 at a write operation (as an erase operation is not performed for the non-volatile cross point array memory component, for example). In some embodiments, the data units that have already been written can store the same value (e.g., logical "1" or logical "0") as the data units that are going to be written.

In some embodiments, a preread operation can be performed prior to a write operation (or the write operation can include a preread operation, which is performed prior to writing data to memory device 130 or memory device 140). The preread operation can first identify locations at memory device 130 or memory device 140 to be written and can read data that is currently stored at the particular location of memory device 130 or memory device 140. Each data unit of the data to be stored (e.g., data from the cache memory) has a corresponding data unit at memory device 130 or memory device 140. The preread operation can also include a comparison sub-operation. For example, if a particular data unit at the memory device 130 or memory device 140 currently stores data that matches a corresponding data unit of the data that is to be written, then the memory sub-system controller 115 can determine not to write the particular data corresponding to that data unit of the data that is to be written (e.g., stored at cache memory) to the location at memory device 130 or memory device 140. Otherwise, if the particular data unit at the memory device 130 or memory device 140 does not match the corresponding data unit of the data that is to be written, then a write operation can be performed at the particular location of memory device 130 or memory device 140.

For example, a voltage signal can be applied to the particular data unit at memory device 130 or memory device 140 to change a value of the data stored at the particular location of the memory device 130 or memory device 140. Therefore, in the normal write operation, the processing device writes data to the memory device 130 or memory device 140 for the data units that include a data value that is different from a data value of a corresponding data unit that is to be written (e.g., stored in cache memory). In a normal write operation, a portion of the memory cells of a data unit (approximately half of the memory cells of a data unit on average) are re-written and the remaining portion of the memory cells of the data unit keep their previous values. In embodiments, a normal write operation can be the most frequently performed write operation of the multiple write operation modes over the life-cycle of the memory component.

In embodiments, a force write operation (also referred to as a "force write" herein) associated with the force write operation mode does not perform the preread operation. Instead, the force write operation can apply a voltage to every data unit of memory device 130 or memory device 140 that is to store data that is to be written (and stored at cache memory). For example, the force write operation can apply a voltage to a data unit to set a value of "0" and can apply another voltage to another data unit to set a value of "1." Thus, the force write operation can write the entire data that is to be written to the memory device 130 or memory device 140. In some embodiments, the force write operation mode can be used to periodically clear memory disturb effects.

In embodiments, a toggle force write operation (also referred to as a "toggle write" or "toggle write operation" herein) associated with a toggle force write operation mode does not perform the preread operation. The toggle force write operation can be referred to as a two-pass force write. A first pass write can be an inverted write where the data is written to a data unit as inverted data (e.g., if the data bit is "0," it is written as "1," and vice versa). A second pass write can be a non-inverted write where the data is written to the data unit as non-inverted data (e.g., if the data bit is "0," it is written as "0," and vice versa). The toggle force write can be periodically used to help reset the memory states of the memory cells.

Further details with respect to memory operation controller 113 are further described below.

Figure 2:
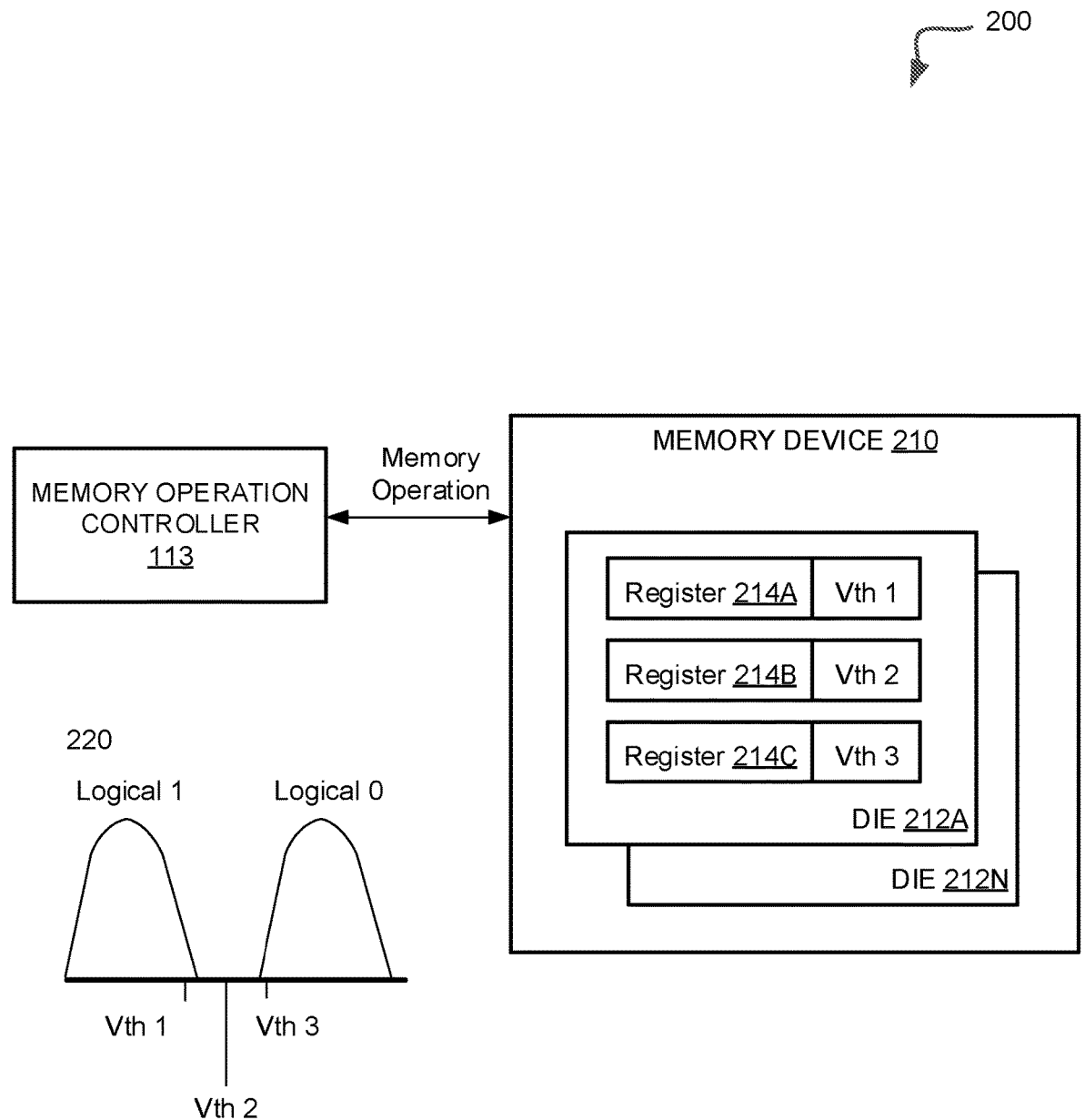
FIG. 2 is a block diagram illustrating memory operations of a memory sub-sub-system, in accordance with some embodiments of the disclosure.

FIG. 2 is a block diagram illustrating memory operations of a memory sub-system, in accordance with some embodiments of the disclosure. In some embodiments, memory operation controller 113 is operatively coupled to memory device 210. In some embodiments, memory device 210 can be an example of one or more memory devices 130 or one or more memory devices 140 of FIG. 1. In some embodiments, memory device 210 is a cross-point array non-volatile memory device.

In some embodiments, memory device 210 can include one or more die, illustrated by die 212A-212N (generally referred to as "die 212" herein). A die can refer to a block of material, such as semiconducting material, on which a functional electronic circuit is fabricated. A memory device, such as memory device 210, can include one or more die 212. In some embodiments, the die 212 of memory device 210 can be packaged in a discrete package that uses terminals, such as leads or solder balls, external to the discrete package. The terminals allow for the transfer of electrical signals external to the memory device 210 to the die of the memory device 210, and vice versa. In some embodiments, each of the die 212 of the memory device 210 is associated with multiple registers, such as registers 214A-214C (generally referred to as "register(s) 214" herein). A register can refer to a data storage device capable of storing binary information. In some embodiments, the registers are a type of volatile memory. In some embodiments, the registers are on-die registers that are fabricated on each of the die 212. In some embodiments, the number of the registers 214 per die is limited and set at manufacturing. In some embodiments, the registers 214 can be used to store particular information, such as threshold voltages (Vth), as illustrated.

In some embodiments, the threshold voltages associated with registers 214 can be at different voltages. For example, threshold voltage 1 (Vth 1) can be less then threshold voltage 2 (Vth 2), and threshold voltage 2 can be less than threshold voltage 3 (Vth 3). In some embodiments, threshold voltages 1-3 are loaded and stored at registers 214 as default values, e.g., at each power-up event. For purposes of illustration, threshold voltage 1 can correspond to a read threshold voltage 1 or preread threshold voltage 1, and can be the same voltage for both operations. For example, the same threshold voltage 1 can be used for both a read operation 1 and preread operation 1. Threshold voltage 2 can correspond to a read threshold voltage 2 or preread threshold voltage 2, and can be the same voltage for both operations. For example, the same threshold voltage 2 can be used for both a read operation 2 and preread operation 2. In some embodiments, threshold voltage 3 can correspond to a read threshold voltage 3 or preread threshold voltage 3, and can be a different voltage for each operation. For example, a different threshold voltage 3, such as read threshold voltage 3 and preread threshold voltage 3, can be used for each of read operation 3 and preread operation 3, respectively. The threshold voltage stored at register 214C can be changed under certain conditions, as described below. In some embodiments, threshold voltage 1, threshold voltage 2, read threshold voltage 3, and preread threshold voltage 3 are different voltage levels.

Graph 220 illustrates an example of threshold voltage distributions for memory cells of a memory device 210. A threshold voltage distribution can illustrate a range of threshold voltages (e.g., normal distribution of threshold voltages) for memory cells programmed at a particular write voltage. The write voltage can be assumed as the midpoint of each distribution. For example, multiple memory cells that are programmed as a logical "1" or logical "0" are programmed with a particular write voltage. The memory cells programmed at the same write voltage can have threshold voltages that fall within the corresponding threshold voltage distributions. The different threshold voltages 1-3 are illustrated as increasing from left to right.

In some embodiments, the default threshold voltages that are loaded and stored at registers 2141-214C are threshold voltage 1, threshold voltage 2, and preread threshold voltage 3.

In some embodiments, the default threshold voltages that are loaded and stored at registers 214A-214C are threshold voltage 1, threshold voltage 2, and read threshold voltage 3. Memory operation controller 113 can request memory device 210 for an indication of the default contents of register 214C (e.g., default register settings). If the indication of the contents of the register 214C indicate that register 214C contains read threshold voltage 3, memory operation controller 113 can load preread threshold voltage 3 at register 214C such that the preread threshold threshold voltage 3 is stored at register 214C as a "default" threshold voltage. In some embodiments, and as noted above preread threshold voltage 3 is used more frequently during the lifetime of the memory device 210 and is to be stored at register 214C for a majority of the lifetime of memory device 210. In some embodiments, memory operation controller 113 can perform a read operation at memory device 210. For example, memory sub-system 110 (e.g., memory operation controller 113) can receive a read request to read data stored at memory device 210. For instance, host system 120 send a request to memory sub-system 110 that identifies particular data to be read from memory device 210. In some embodiments, memory operation controller 113 performs a read operation at memory device 210 responsive to receiving the read request. Memory operation controller 113 can perform the read operation at memory device 210 using read threshold voltage 1 stored at register 214A. The data read at memory device 210 can be sent from memory device 210 to memory sub-system 110 where the data is stored at a buffer associated with memory sub-system controller 115.

In an illustrative example, memory sub-system 110 can use a striping scheme that writes or stripes a data payload (e.g., user data) across multiple die 212. For instance, user data is written across 16 die of the memory device 210. 15 of the die 212 store a portion of the user data as a codeword. The codeword can also include parity data (e.g., parity bit) which can be used as parity for the user data of the codeword. In some examples, one of die 212 can store parity data for all the codewords. For instance, the first 15 die can store codewords that corresponds to the portions of user data and respective codeword parity bits and the 16$^{th}$ die can store parity data for the first 15 codewords (e.g., an XOR of codewords for die 1 through 15). When the user data is read from the memory device 210, each codeword that corresponds to the user data is read from the multiple die 212 and sent to the buffer associated with the memory sub-system controller 115 where it is temporarily stored.

In some embodiments, memory operation controller 113 can perform an ECC operation on the data stored at the buffer to determine if there are errors in the data. If the memory operation controller 113 determines that there is an error, the ECC operation (e.g., tier 1 ECC) can be further applied to the data stored at the buffer in an attempt to correct the error(s). If there are no errors in the data or if the ECC operation is able to correct the errors in the data (e.g., successful correction), memory operation controller 113 sends the (corrected) data to host system 120. It can be noted that an ECC operation can correct a particular number of errors. If the number of errors in the data is less or equal to the number of errors the ECC operation is able to correct, the ECC operation corrects those errors (e.g., successful correction). If the number of errors in the data is greater than the number of errors that the ECC operation is able to correct, the ECC operation results in an unsuccessful correction where the errors in the data are not corrected.

For example and as noted above, one or more of the codewords from the multiple die 212 can includes errors. In some embodiments, the ECC operation can correct errors for a single codeword. However, if multiple codewords have errors, the ECC operation can result in an unsuccessful correction.

In some embodiments, memory operation controller 113 is not able to correct the errors in the data stored at the buffer of the memory sub-system controller 115. For example, the number of errors exceeds the error correction capability of the ECC operation. In some embodiments, if the read operation using the read threshold voltage 1 results in an unsuccessful correction of errors, memory operation controller 113 can perform another read operation using another read threshold voltage, such as read threshold voltage 2 stored at register 214B. As noted above, in some embodiments read threshold voltage 2 is greater than read threshold voltage 1. Using a higher read threshold voltage to read the data at memory device 210 can result in fewer read errors, in some instances (e.g., errors that result from a shift in the threshold voltage distributions).

For example and as noted above, one or more of the codewords from the multiple die 212 can includes errors. In some instances, the ECC operation can correct errors for a single codeword. However, if multiple codewords have errors, the ECC operation can result in an unsuccessful correction. The memory operation controller 113 can perform another read operation using a threshold voltage that is higher than the previously used threshold voltage in attempt to reduce the errors that result from the read threshold voltage being too low to accurately read the data from the die which the codeword errors are associated.

In some embodiments, memory operation controller 113 performs the read operation using the read threshold voltage 2 stored at register 214B. Similar to the read operation using read threshold voltage 1, the data read at memory device 210 (using read threshold voltage 2) can be sent from memory device 210 to memory sub-system 110 where the data is stored at a buffer associated with memory sub-system controller 115.

In some embodiments, memory operation controller 113 can perform an ECC operation on the data (read using read threshold voltage 2) stored at the buffer to determine if there are one or more errors in the data. If the memory operation controller 113 determines that there is an error, the ECC operation (e.g., tier 1 ECC) can be further applied to the data stored at the buffer in attempt to correct the error. If there are no errors in the data or if the ECC operation is able to correct the errors in the data (e.g., successful correction), memory operation controller 113 sends the (corrected) data to host system 120. If the number of errors in the data is greater than the number of errors that the ECC operation is able to correct, the ECC operation results in an unsuccessful correction where the errors in the data are not corrected.

In some embodiments, memory operation controller 113 is not able to correct the errors in the data (e.g., read using read threshold voltage 2) stored at the buffer of the memory sub-system controller 115. In some embodiments, if the read operation using the read threshold voltage 2 results in an unsuccessful correction of errors, memory operation controller 113 can perform another read operation using another read threshold voltage, such as read threshold voltage 3.

As noted above, the default threshold voltage stored at register 214 can be preread threshold voltage 3, in some embodiments. Responsive to determining that the data read (e.g., using read threshold voltage 1 or read threshold voltage 2) is associated with an unsuccessful correction, memory operation controller 113 can store read threshold voltage 3 at register 214C to replace preread threshold voltage 3 that was previously stored at register 214C.

For example, responsive to determining that the data read (e.g., using read threshold voltage 1 or read threshold voltage 2) is associated with an unsuccessful correction, memory operation controller 113 can identify the read threshold voltage 3 that is stored at local memory 119, and send read threshold voltage 3 to memory device 210 such that read threshold voltage 3 is stored at register 214C.

In some embodiments, memory operation controller 113 performs the read operation using the read threshold voltage 3 stored at register 214C. Similar to the read operation using read threshold voltage 1 or read threshold voltage 2, the data read at memory device 210 (using read threshold voltage 3) can be sent from memory device 210 to memory sub-system 110 where the data is stored at a buffer associated with memory sub-system controller 115.

In some embodiments, memory operation controller 113 can perform an ECC operation on the data (read using read threshold voltage 3) stored at the buffer to determine if there are errors in the data. If the memory operation controller 113 determines that there is an error(s), the ECC operation (e.g., tier 1 ECC) can be further applied to the data stored at the buffer in attempt to correct the error(s). If there are no errors in the data or if the ECC operation is able to correct the error(s) in the data (e.g., successful correction), memory operation controller 113 sends the (corrected) data to host system 120. If the number of errors in the data is greater than the number of errors that the ECC operation is able to correct, the ECC operation results in an unsuccessful correction where the errors in the data are not corrected. In some embodiments, if the ECC operation is not able to correct the data read from memory device 210 using the read threshold voltage 3, an additional ECC operation (e.g., tier 2 ECC operation than can correct more errors than a tier 1 ECC operations) can be used to correct the errors. It can be noted that read operations using three different read threshold voltages are described above. In other embodiments, one or more read operations can be performed where the read operations are performed using different read threshold voltages.

Responsive to correcting the errors in the data read from memory device 210 using read threshold voltage 3, memory operation controller 113 replaces the read threshold voltage stored at register 214C with preread threshold voltage 3.

In some embodiments, memory sub-system 110 (e.g., memory operation controller 113) can receive a request from host system 120 to perform a write operation to write data at memory sub-system 110. In some embodiments, responsive to receiving a request to perform a write operation, memory operation controller 113 can perform a preread operation.

In some embodiments, memory operation controller 113 can perform one or more preread operations, where each of the preread operations is performed using different preread threshold voltages.

In some embodiments, memory operation controller 113 can implement a dual voltage scheme preread operation (also referred to as "dual voltage scheme" herein), where memory operation controller 113 performs at least two preread operations using two different preread threshold voltages. In the dual voltage scheme, the two preread threshold voltages can be preread/read threshold voltage 1 stored at register 214A and preread threshold voltage 3 stored at register 214C. In some embodiments, preread threshold voltage 1 is less than preread threshold voltage 3. In the dual voltage scheme, memory operation controller 113 can perform a preread operation using preread threshold voltage 1 to read data at a location (e.g., memory cells) at memory device 210 where the data to be written is to be stored. Memory operation controller 113 can also perform another preread operation using preread threshold voltage 3 to read the same data stored at the same location at memory device 210.

In some embodiments, the two preread operations of the dual voltage scheme can help determine whether the data (e.g., bits) can be reliably read from the memory device 210. For instance, if the preread operations using the different preread threshold voltages read different values for the same memory cell (e.g., because the bit for the memory cell is at the tail end (3+sigma) of the threshold voltage distribution), memory operation controller 113 can determine that the value of the memory cell cannot be reliably read. In some embodiments, if it is determined that a memory cell cannot be reliably read, memory operation controller 113 can determine to write the data to the memory cell even though one of the preread operations read a value the matched the value to be written. If the preread operations using the different preread threshold voltages read the same values for the same memory cell, memory operation controller 113 can determine that the value of the memory cell can be reliably read. In some embodiments, if memory operation controller 113 determines that a memory cell can reliably read, memory operation controller 113 can determine not to write the matching data to the memory cell.

In some embodiments, the dual voltage scheme can be implemented as follows. If the bit to be written to a particular memory cell is logical "0," memory operation controller 113 can determine the memory cell can be reliably read if the preread operation using at least preread threshold voltage 3 reads a logical "0" at the particular memory cell. If the bit to be written to a particular memory cell is logical "1," memory operation controller 113 can determine the memory cell can be reliably read if the preread operation using at least preread threshold voltage 1 reads a logical "1" at the particular memory cell. In all other cases, memory operation controller 113 determines that memory cell is not reliably read (e.g., unreliably read). If memory operation controller 113 determines that the memory cell can be reliably read, memory operation controller 113 does not write to the particular memory cell during a write operation. If the memory operation controller 113 determines that the memory cell cannot be reliably read, memory operation controller 113 writes to the particular memory cell during a write operation. The above be applied to each memory cell of a data unit that is written as part of the write operation.

In some embodiments, the preread threshold voltage 3 is kept stored at register 214C after performing the preread operation(s). As noted above, in situations where a read operation uses read threshold voltage 3, preread threshold voltage 3 is temporarily replaced by read threshold voltage 3. After the read operation using read threshold voltage 3 is completed, memory operation controller 113 replaces the read threshold voltage 3 at register 214C with preread threshold voltage 3.

The methods 300 and 400 of FIG. 3 and FIG. 4, respectively, described below can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 or 400 is performed by memory operation controller 113 of FIG. 1. Although shown in a particular sequence or order, unless otherwise specified, the sequence or order of the operations can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. In some embodiments, the same, different, greater, or fewer operations can be performed.

Figure 3:
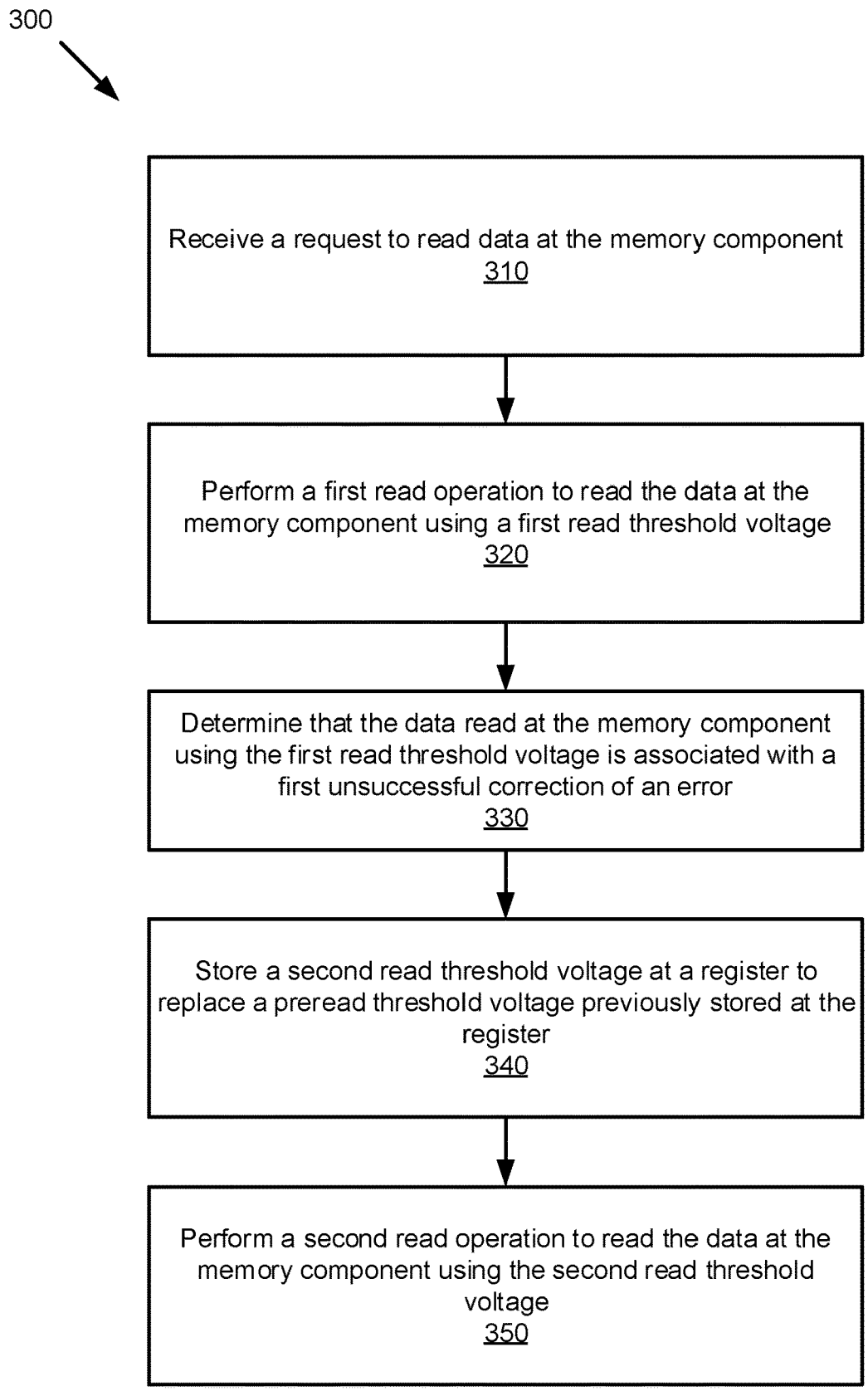
FIG. 3 is a flow diagram of an example method of performing a read operation at a memory sub-system, in accordance with embodiments of the disclosure.

FIG. 3 is a flow diagram of an example method of performing a read operation at memory sub-system, in accordance with embodiments of the disclosure.

At operation 310, the processing logic receives a request to read data at the memory component. In some embodiments, the memory component includes cross-point array memory.

At operation 320, processing logic performs a first read operation to read the data at the memory component using a first read threshold voltage. For example, processing logic can perform a read operation at read threshold voltage 1 or read threshold voltage 2, as described above.

At operation 330, processing logic determines that the data read at the memory component using the first read threshold voltage is associated with a first unsuccessful correction of an error. For example, the data read at the memory component using the first read threshold voltage has one or more errors that cannot be corrected by tier 1 ECC.

At operation 340, processing logic stores a second read threshold voltage at a register to replace a first preread threshold voltage previously stored at the register. In some embodiments, operation 340 is performed responsive to determining that the data read at the memory component using the first read threshold voltage is associated with the first unsuccessful correction of the error. In some embodiments, the first preread threshold voltage was previously used to perform a preread operation at the memory component. In some embodiments, the first read threshold voltage is less than the second read threshold voltage.

In some embodiments, the register is associated with the memory component. In some embodiments, the register is an on-die register associated with a die of the memory component.

At operation 350, processing logic performs a second read operation to read the data at the memory component using the second read threshold voltage (e.g., read threshold voltage 3). In some embodiments, operation 350 is performed responsive to determining that the data read at the memory component using the first read threshold voltage is associated with the first unsuccessful correction of the error.

In some embodiments, responsive to determining that the data read at the memory component using the first read threshold voltage is associated with the first unsuccessful correction of the error, processing logic performs a third read operation to read the data at the memory component using a third read threshold voltage. Processing logic determines that the data read at the memory component using the third read threshold voltage is associated with a second unsuccessful correction of the error. The third read operation is performed prior to the second read operation. Performing the second read operation is responsive to determining that the data read at the memory component using the first read threshold voltage is associated with the first unsuccessful correction of the error and determining that the data read at the memory component using the third read threshold voltage is associated with the second unsuccessful correction of the error. In some embodiments, at least one of the first read threshold voltage or the second read threshold voltage was preloaded at a corresponding register associated with the memory component prior to receiving the request to read data at the memory component.

For example, the third read threshold voltage can correspond to read threshold voltage 2 as described above, and the third read operation can be performed between the first read operation and the second read operation. Both the first read operation and the third read operation can result in unsuccessful corrections of the error.

In some embodiments, processing logic stores a first preread threshold voltage at the register associated with the memory component, responsive to performing the second read operation to read the data at the memory component using the second read threshold voltage. In some embodiments, the data is first data. Processing logic receives a request to write second data at the memory component. Responsive to receiving the request to write the second data at the memory component, processing logic performs a first preread operation to read third data at the memory component using the first preread threshold voltage loaded at the register. Processing logic determines data values of a first subset of the second data (e.g., to be written) that match data values of a first subset of the third data (stored at memory component), and data values of a second subset of the second data that differ from data values of a second subset of the third data based on the preread operation. Processing logic performs a write operation that writes the data values of the second subset of the second data that differ from data values of the second subset, and refrains from rewriting the data values of the first subset of the third data that match the data values of the first subset of the third data.

In some embodiments, prior to receiving the request to read data at the memory component, processing logic determines whether a default voltage stored at the register associated with the memory component is the second read threshold voltage (e.g., read threshold voltage 3). Responsive to determining that the default voltage for the register associated with the memory component is the second read threshold voltage, processing logic stores a first preread threshold voltage at the register to replace the default voltage previously stored at the register.

Figure 4:
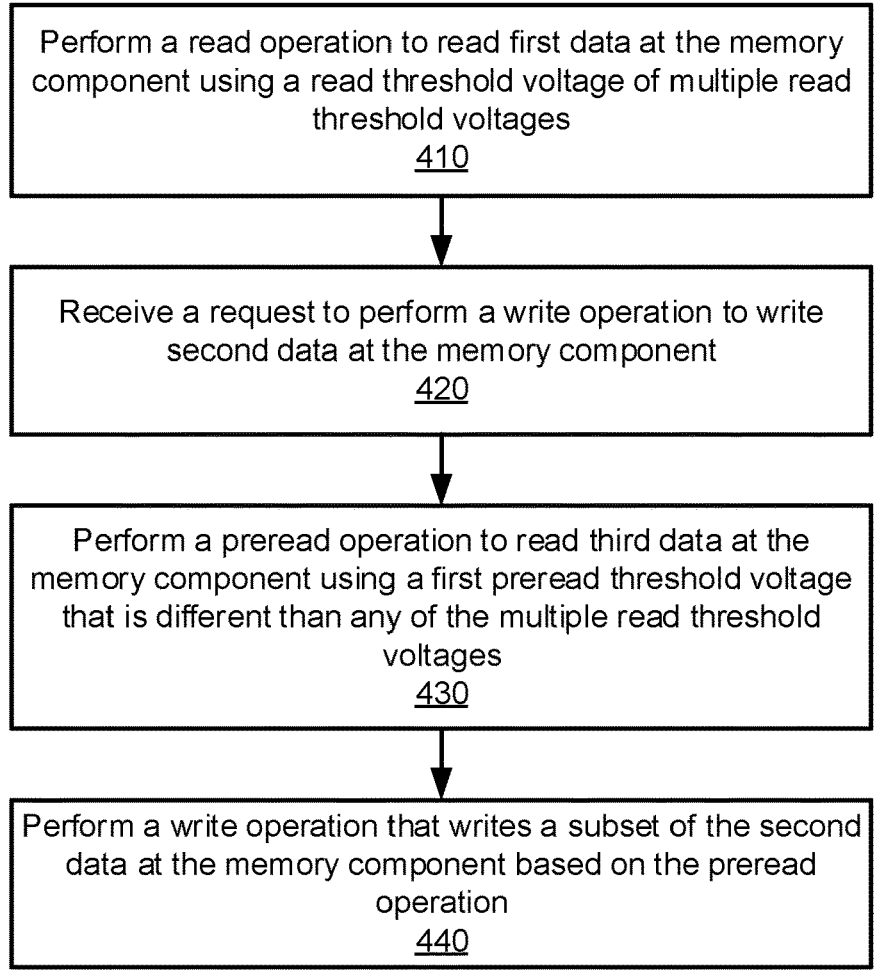
FIG. 4 is a flow diagram of an example method of performing a write operation at a memory sub-system, in accordance with embodiments of the disclosure.

FIG. 4 is a flow diagram of an example method of performing a write operation at memory sub-system, in accordance with embodiments of the disclosure.

At operation 410, processing logic performs a read operation to read first data at the memory component using a read threshold voltage of multiple read threshold voltages. The multiple read threshold voltage are used to perform read operations at the memory component.

At operation 420, processing logic receives a request to perform a write operation to write second data at the memory component. For example, memory sub-system 110 can receive a request to write data at memory sub-system 110 from host system 120.

At operation 430, processing logic performs a preread operation to read third data at the memory component using a first preread threshold voltage that is different than any of the multiple read threshold voltages. In some embodiments, operation 430 is performed responsive to receiving the request to write the second data at the memory component.

In some embodiments, the subset of the second data is a second subset of the second data. To perform the preread operation, processing logic determines data values of a first subset of the second data that match data values of a first subset of the third data, and data values of the second subset of the second data (e.g., data to be written) that differ from data values of a second subset of the third data (e.g., stored at the memory component).

At operation 440, processing logic performs a write operation that writes a subset of the second data at the memory component based on the preread operation. In some embodiments, operation 440 is performed responsive to receiving the request to write the second data at the memory component.

In some embodiments, to perform a write operation, processing logic refrains from rewriting the data values of the first subset of the third data that match the data values of the first subset of the third data.

In some embodiments, the read voltage of the multiple read threshold voltages is a first read threshold voltage. Processing logic determines that the first data read at the memory component using the first read threshold voltage is associated with a first unsuccessful correction of an error. Responsive to determining that the first data read at the memory component using the first read threshold voltage is associated with the first unsuccessful correction of the error, processing logic stores a second read threshold voltage at a register to replace a first preread threshold voltage previously stored at the register that is associated with the memory component. The first preread threshold voltage was previously used to perform a preread operation at the memory component. Processing logic performs a second read operation to read the data at the memory component using the second read threshold voltage.

In some embodiments, responsive to determining that the first data read at the memory component using the first read threshold voltage is associated with the first unsuccessful correction of the error, processing logic performs a third read operation to read the first data at the memory component using a third read threshold voltage of the multiple read threshold voltages. Processing logic determines that the first data read at the memory component using the third read threshold voltage is associated with a second unsuccessful correction of the error. The third read operation is performed prior to the second read operation. In some embodiments, processing logic performs the second read operation responsive to determining that the data read at the memory component using the first read threshold voltage is associated with the first unsuccessful correction of the error and determining that the data read at the memory component using the third read threshold voltage is associated with the second unsuccessful correction of the error.

In some embodiments, the preread operation is a first preread operation. Processing logic performs a second preread operation to read the third data at the memory component using a second preread threshold voltage. The second preread threshold voltage is a same threshold voltage as one of the multiple read threshold voltages and a different threshold voltage than the first preread threshold voltage. In some embodiments, the first preread threshold voltage is greater than the second preread threshold voltage.

Figure 5:
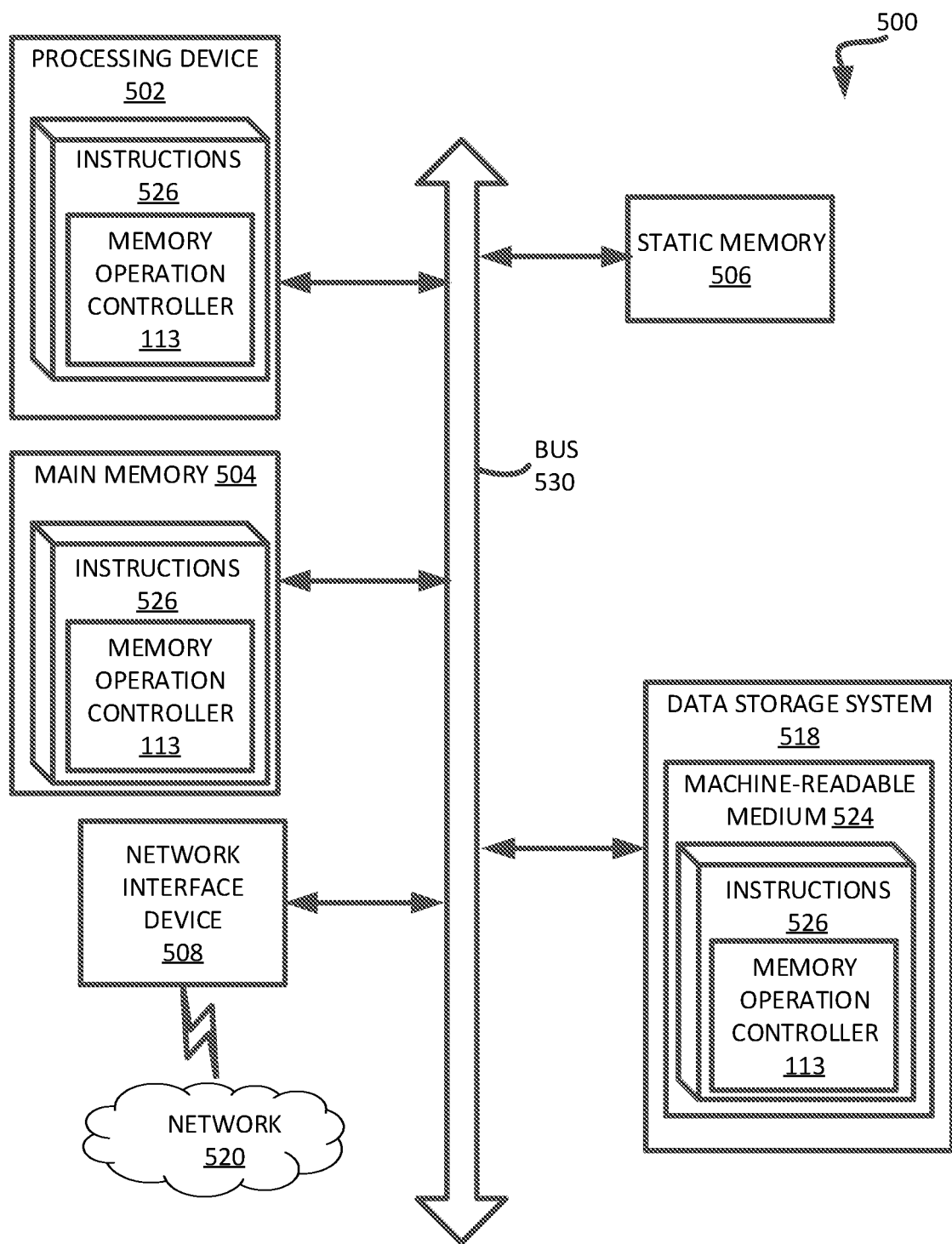
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to memory operation controller 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to memory operation controller 113 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to:
   receive a request to perform a write operation to write first data to the memory device;
   perform a first preread operation to read second data at the memory device using a first preread threshold voltage;
   responsive to determining that the second data is associated with a first unsuccessful error correction operation, store a second preread threshold voltage at a register to replace the first preread threshold voltage previously stored at the register;

perform a second preread operation to read the second data at the memory device using the second preread threshold voltage; and perform, based on the second preread operation, a write operation that writes a subset of the first data to the memory device.

2. The system of claim 1, wherein performing the first preread operation further comprises:

determining data values of a first subset of the second data that match data values of a first subset of third data, and data values of a second subset of the second data that differ from data values of a second subset of the third data.

3. The system of claim 2, wherein performing the write operation further comprises:

maintaining the data values of the first subset of the second data that match the data values of the first subset of the third data.

4. The system of claim 1, wherein the first preread threshold voltage is greater than the second preread threshold voltage.

5. The system of claim 1, wherein the processing device is further to:

pre-load the first preread threshold voltage to the register.

6. The system of claim 1, wherein the register is an on-die register associated with a die of the memory device.

7. The system of claim 1, wherein the processing device is further to:

receive a request to read data at the memory device;
perform a first read operation to read the data at the memory device using a first read threshold voltage.

8. A method comprising:

receiving, by a processing device, a request to perform a write operation to write first data to a memory device;

performing a first preread operation to read second data at the memory device using a first preread threshold voltage;

responsive to determining that the second data is associated with a first unsuccessful error correction operation, storing a second preread threshold voltage at a register to replace the first preread threshold voltage previously stored at the register;

performing a second preread operation to read the second data at the memory device using the second preread threshold voltage; and performing, based on the second preread operation, a write operation that writes a subset of the first data to the memory device.

9. The method of claim 8, wherein performing the first preread operation further comprises:

determining data values of a first subset of the second data that match data values of a first subset of third data, and data values of a second subset of the second data that differ from data values of a second subset of the third data.

10. The method of claim 9, wherein performing the write operation further comprises:

maintaining the data values of the first subset of the second data that match the data values of the first subset of the third data.

11. The method of claim 8, wherein the first preread threshold voltage is greater than the second preread threshold voltage.

12. The method of claim 8, further comprising:

pre-loading the first preread threshold voltage to the register.

13. The method of claim 8, wherein the register is an on-die register associated with a die of the memory device.

14. The method of claim 8, further comprising:

receiving a request to read data at the memory device;
performing a first read operation to read the data at the memory device using a first read threshold voltage.

15. A non-transitory computer-readable storage medium comprising executable instructions that, when executed by a processing device, cause the processing device to:

receive a request to perform a write operation to write first data to a memory device;

perform a first preread operation to read second data at the memory device using a first preread threshold voltage;

responsive to determining that the second data is associated with a first unsuccessful error correction operation, store a second preread threshold voltage at a register to replace the first preread threshold voltage previously stored at the register;

perform a second preread operation to read the second data at the memory device using the second preread threshold voltage; and perform, based on the second preread operation, a write operation that writes a subset of the first data to the memory device.

16. The non-transitory computer-readable storage medium of claim 15, wherein performing the first preread operation further comprises:

determining data values of a first subset of the second data that match data values of a first subset of third data, and data values of a second subset of the second data that differ from data values of a second subset of the third data.

17. The non-transitory computer-readable storage medium of claim 16, wherein performing the write operation further comprises:

maintaining the data values of the first subset of the second data that match the data values of the first subset of the third data.

18. The non-transitory computer-readable storage medium of claim 15, wherein the first preread threshold voltage is greater than the second preread threshold voltage.

19. The non-transitory computer-readable storage medium of claim 15, further comprising executable instructions that, when executed by the processing device, cause the processing device to:

pre-load the first preread threshold voltage to the register.

20. The non-transitory computer-readable storage medium of claim 15, further comprising executable instructions that, when executed by the processing device, cause the processing device to:

receive a request to read data at the memory device;
perform a first read operation to read the data at the memory device using a first read threshold voltage.

* * * * *